(12) United States Patent
Sridharan et al.

(10) Patent No.: US 12,142,586 B2
(45) Date of Patent: Nov. 12, 2024

(54) EFFICIENT REDISTRIBUTION LAYER TOPOLOGY

(71) Applicant: TEXAS INSTRUMENTS INCORPORATED, Dallas, TX (US)

(72) Inventors: Vivek Swaminathan Sridharan, Dallas, TX (US); Christopher Daniel Manack, Flower Mound, TX (US); Joseph Liu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/809,854

(22) Filed: Jun. 29, 2022

(65) Prior Publication Data

US 2022/0328438 A1    Oct. 13, 2022

Related U.S. Application Data

(63) Continuation of application No. 16/950,708, filed on Nov. 17, 2020, now Pat. No. 11,380,637.

(60) Provisional application No. 63/036,498, filed on Jun. 9, 2020.

(51) Int. Cl.
*H01L 23/00* (2006.01)

(52) U.S. Cl.
CPC .............. *H01L 24/05* (2013.01); *H01L 24/13* (2013.01); *H01L 24/16* (2013.01); *H01L 2224/05015* (2013.01); *H01L 2224/05093* (2013.01); *H01L 2224/05098* (2013.01); *H01L 2224/13026* (2013.01); *H01L 2224/16227* (2013.01); *H01L 2924/01013* (2013.01); *H01L 2924/01022* (2013.01); *H01L 2924/01028* (2013.01); *H01L 2924/01029* (2013.01); *H01L 2924/01074* (2013.01)

(58) Field of Classification Search
CPC ......... H01L 24/05; H01L 24/13; H01L 24/16; H01L 2224/05015; H01L 2224/05093; H01L 2224/05098; H01L 2224/13026; H01L 2224/16227; H01L 23/3171; H01L 23/562; H01L 24/11; H01L 24/03; H01L 2224/0401; H01L 2224/05556; H01L 2224/05558
See application file for complete search history.

(56) References Cited

U.S. PATENT DOCUMENTS

| | | | |
|---|---|---|---|
| 7,098,540 B1 | 8/2006 | Mohan et al. | |
| 9,899,284 B2 | 2/2018 | Lin | |
| 11,380,637 B2* | 7/2022 | Sridharan | ............... H01L 24/16 |
| 2005/0205993 A1* | 9/2005 | Yamaguchi | ............. H01L 24/03 |
| | | | 257/E23.021 |

(Continued)

*Primary Examiner* — Douglas W Owens
(74) *Attorney, Agent, or Firm* — Yudong Kim; Frank D. Cimino (57) ABSTRACT

In some examples, a chip scale package (CSP) comprises a semiconductor die; a passivation layer abutting the semiconductor die; a via extending through the passivation layer; and a first metal layer abutting the via. The CSP also includes an insulation layer abutting the first metal layer, with the insulation layer having an orifice with a maximal horizontal area of less than 32400 microns$^2$. The CSP further includes a second metal layer abutting the insulation layer and adapted to couple to a solder ball. The second metal layer abuts the first metal layer at a point of contact defined by the orifice in the insulation layer.

22 Claims, 12 Drawing Sheets

(56) References Cited

U.S. PATENT DOCUMENTS

| | | | |
|---|---|---|---|
| 2006/0163722 A1* | 7/2006 | Hsu | H01L 23/5389 257/737 |
| 2008/0169539 A1* | 7/2008 | Fang | H01L 24/03 257/676 |
| 2020/0211988 A1 | 7/2020 | Jahja et al. | |

* cited by examiner

EFFICIENT REDISTRIBUTION LAYER TOPOLOGY

CROSS-REFERENCE TO RELATED APPLICATIONS

This application is a continuation of U.S. patent application Ser. No. 16/950,708, entitled "Efficient Redistribution Layer Topology," filed Nov. 17, 2020, which claims the benefit of U.S. Provisional Patent Application No. 63/036,498, entitled "Enhanced WCSP Design For Improved Performance And Higher Routing Density," filed Jun. 9, 2020, and each of which is hereby incorporated by reference in its entirety herein.

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame pad. The assembly is later covered in a mold compound, such as epoxy, to protect the assembly from potentially damaging heat, physical trauma, moisture, and other deleterious factors. The finished assembly is called a semiconductor package or, more simply, a package. The leads are exposed to surfaces of the package and are used to electrically couple the packaged chip to devices outside of the chip.

However, other types of packages, commonly known as flip-chip packages, are configured differently than described above. Flip-chip packages include a die, metallic bumps (e.g., solder bumps), and a redistribution layer (RDL) that interfaces between the die and the metallic bumps so that signals are routed appropriately between the bumps and the active circuitry formed on the die. Examples of such flip-chip packages include chip scale packages (CSPs), such as wafer chip scale packages (WCSPs).

SUMMARY

In some examples, a chip scale package (CSP) comprises a semiconductor die; a passivation layer abutting the semiconductor die; a via extending through the passivation layer; and a first metal layer abutting the via. The CSP also includes an insulation layer abutting the first metal layer, with the insulation layer having an orifice with a maximal horizontal area of less than 32400 microns$^2$. The CSP further includes a second metal layer abutting the insulation layer and adapted to couple to a solder ball. The second metal layer abuts the first metal layer at a point of contact defined by the orifice in the insulation layer.

BRIEF DESCRIPTION OF THE DRAWINGS

For a detailed description of various examples, reference will now be made to the accompanying drawings in which.

DETAILED DESCRIPTION

Various types of redistribution layers (RDLs) are used in chip scale packages (CSPs) to route electrical signals between the semiconductor dies of the CSPs to the solder balls of the CSPs. Many RDLs include passivation layers abutting the semiconductor die to protect the semiconductor die from external elements and stresses. These passivation layers have orifices that facilitate the transfer of electrical signals between the semiconductor die and metal layers of the RDL. In some RDLs, the passivation layers (called non-planar passivation layers) have non-uniform thicknesses, particularly adjacent to the orifices, where the passivation layers may include raised segments. These raised segments can be vulnerable to the deleterious effects of mechanical stress imparted by the solder ball and under bump metallization (UBM) coupled to the solder ball. To protect the passivation layer, and especially the raised segments, from such stresses, the passivation layer raised segments and orifices may be located relatively far away from the UBM. In this way, stresses from the UBM do not damage the passivation layer. However, such a topology is inefficient in its use of space.

Other RDLs eliminate the need to position the passivation layer raised segments and orifices far away from the UBM by eliminating the raised segments. Instead, such RDLs include passivation layers (called planar passivation layers) that have substantially uniform thicknesses without the raised segments, and such passivation layers also include multiple vias that facilitate electrical communication between the semiconductor die and the UBM. This topology enables the vias to be positioned anywhere, for example, directly below the UBM, which would not be possible with other types of passivation layers. However, RDLs with this topology still use space inefficiently because they include large capture pads, which are the metal layers positioned under the UBMs that couple the UBMs to the vias or to other metal layers, and further because they include large orifices between the capture pads and the UBMs, which limits flexibility in RDL topology design. Such large capture pads with large orifices cause a large amount of space to be used for each solder bump and UBM—space that could otherwise have been more efficiently used for other RDL features such as metal layers that connect to vias, other solder balls, etc. Such inefficient use of space results in undesirably large CSPs.

This disclosure describes various examples of an efficient RDL topology that solves the challenges described above. Specifically, the RDL includes a passivation layer abutting the semiconductor die of the CSP and a via extending through the passivation layer. The RDL includes a first metal layer abutting the via and an insulation layer abutting the first metal layer. The insulation layer has an orifice with a maximal horizontal dimension of less than 50 microns. The RDL also includes a second metal layer abutting the insulation layer and adapted to couple to a solder ball. The second metal layer abuts the first metal layer at a point of contact defined by the orifice in the insulation layer. Because the orifice is relatively small, the size of the capture pad is reduced, and because the size of the capture pad is reduced, the space that would otherwise have been occupied by the capture pad may now instead be used for other RDL features, such as metal layers that connect to vias, other solder balls, etc. This topology has several advantages. For instance, the efficient use of space enables the CSP size to be reduced. The improved layout capability of this RDL improves the electromigration performance of the CSP at the lower metal levels of the semiconductor die. The topology also has application-specific benefits that result from the efficient use of space. For example, CSP semiconductor dies implementing field effect transistors (FETs) and the RDL topology described herein may experience significant improvements in drain-source on resistance ($R_{DS(ON)}$) and the elimination of FET metal layers while achieving comparable or superior performance. Examples of RDL topology are now described with reference to the drawings.

Figure 1:
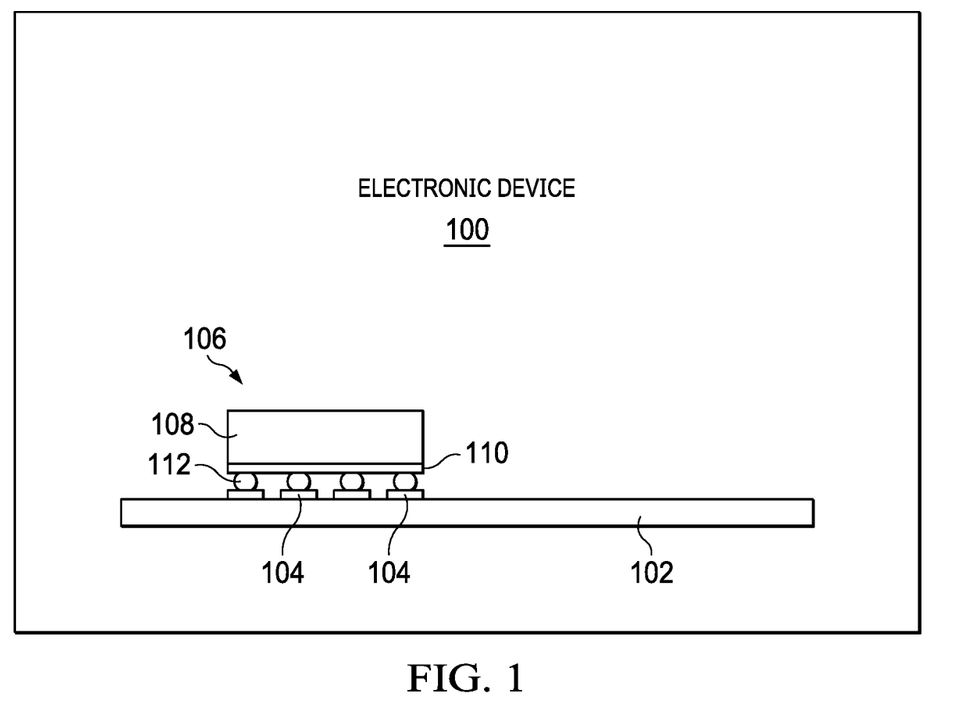
FIG. 1 is a schematic diagram of an electronic device including a chip scale package (CSP) implementing an efficient redistribution layer (RDL) topology, in accordance with various examples.

FIG. 1 is a schematic diagram of an electronic device including a chip scale package (CSP) implementing an efficient redistribution layer (RDL) topology, in accordance with various examples. Specifically, FIG. 1 shows an electronic device 100, such as a laptop or notebook computer, a workstation, a smartphone, an automobile, an aircraft, a television, or any other suitable electronic device. The electronic device 100 includes a printed circuit board (PCB) 102, which may have coupled thereto any of a variety of electronic components, including processors, microcontrollers, memory, passive components, application-specific integrated circuits (ASICs), etc. The PCB 102 may include conductive terminals 104 (e.g., copper pads or traces) that facilitate coupling to such electronic components. The electronic device 100 includes a CSP 106 coupled to the conductive terminals 104. Although FIG. 1 shows one CSP, in examples, the electronic device 100 includes multiple CSPs. FIG. 1 shows the contents of the electronic device 100 in a profile, cross-sectional view.

The CSP 106 implements an efficient RDL topology in accordance with various examples. In examples, the CSP 106 includes a semiconductor die 108 that is coupled to an RDL 110 having an efficient topology. This description describes various such efficient RDL topologies, and in the genericized example RDL 110 of FIG. 1, the RDL 110 may implement any such RDL topology or variation thereof. The RDL 110 couples to solder balls (also called solder bumps) 112. The solder balls 112, in turn, couple to the conductive terminals 104. In this way, the circuitry formed in and/or on the semiconductor die 108 is configured to communicate with circuitry on the PCB 102 via the solder balls 112 and the RDL 110, which interfaces the circuitry of the semiconductor die 108 with the solder balls 112.

The size of the CSP 106 is determined at least in part by the topological efficiency of the RDL 110. Assuming the functionality of the CSP 106 remains static, an efficient use of space in the RDL 110 decreases the size of the RDL 110, thus decreasing the size of the CSP 106. Alternatively, assuming that the size of the CSP 106 remains static, an efficient use of space in the RDL 110 enables the incorporation of additional circuitry, and thus increased functionality, in the CSP 106.

Figure 2:
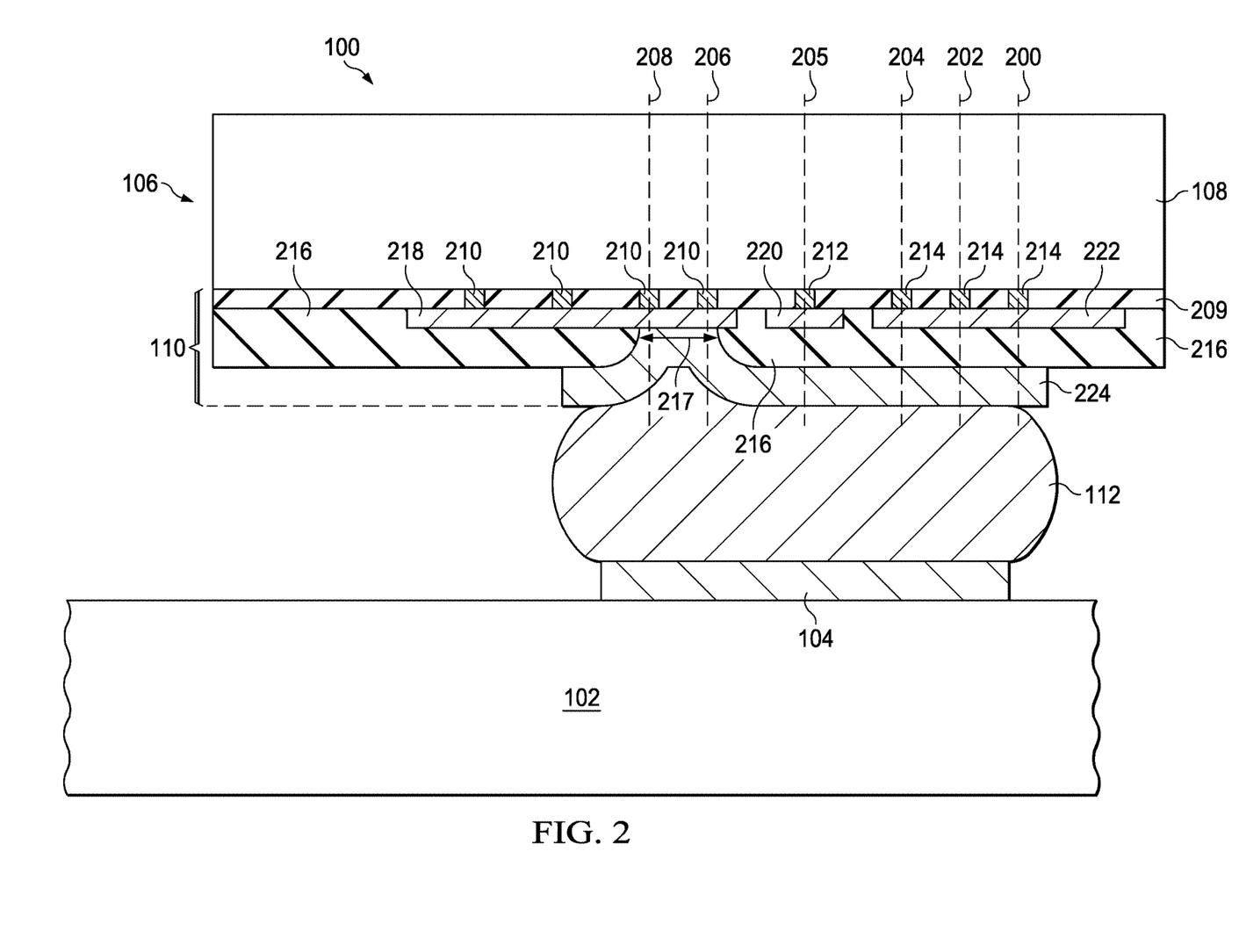
FIG. 2 is a profile, cross-sectional view of a portion of an electronic device that includes a CSP implementing an efficient RDL topology, in accordance with various examples.

FIG. 2 is a profile, cross-sectional view of a portion of an electronic device that includes a CSP implementing an efficient RDL topology, in accordance with various examples. In particular, FIG. 2 shows a detailed view of the RDL 110. In examples, the RDL 110 includes a passivation layer 209 that is configured to protect the semiconductor die 108. For example, the passivation layer 209 may be composed of a suitable oxide layer, a suitable nitride layer, or any other suitable type of layer (e.g., $SiO_2$, $Si_3N_4$, SiN, SiON). The passivation layer 209 may have any suitable thickness as may be appropriate for a given application. The passivation layer 209 may include multiple vias that extend through the passivation layer 209 and that facilitate the transfer of electrical signals through the passivation layer 209 (e.g., between a lower-level metal layer (e.g., copper or aluminum) in the semiconductor die 108 and the rest of the RDL 110). These vias, such as vias 210, 212, 214, may be composed of a suitable conductive material, such as a metal (e.g., tungsten, copper) or a metal alloy and may have any suitable shape and size (e.g., horizontal areas ranging from 0.0625 microns$^2$ to 6400 microns$^2$). In examples, the passivation layer 209 is a planar passivation layer, meaning that the thickness of the passivation layer 209 is approximately uniform throughout. As used herein, a substantially uniform thickness is a thickness with no more than 1 micron of variation in thickness from the thickest to the thinnest segments. Stated in another way, in some examples, no part of the passivation layer 209 abuts a top surface (e.g., a surface abutting the semiconductor die 108) or a bottom surface (e.g., a surface abutting a metal layer 218, 220, 222) of any of the vias 210, 212, 214. Stated still another way, the top and bottom surfaces of the vias 210, 212, 214 are approximately flush with the top and bottom surfaces, respectively, of the passivation layer 209. As used herein, the term approximately flush means flush within a margin of plus or minus 1 micron. When the passivation layer 209 is planar, it is not vulnerable to mechanical stresses from the solder ball 112 once the solder ball 112 has been coupled to the PCB 102. No area of the passivation layer 209 is subject to significantly more stress than any other area of the passivation layer 209. Accordingly, because the passivation layer 209 is uniform in this sense, the vias 210, 212, 214 may be positioned as desired in the passivation layer 209. This is in contrast to other CSPs in which the passivation layer is non-planar and includes a raised segment near or on conductive terminals that electrically couple the metal layers of the RDL to the semiconductor die. In such CSPs, the non-planar areas of the passivation layer are vulnerable to the aforementioned mechanical stresses. Thus, the non-planar areas of the passivation layer, and thus the conductive terminals co-located with these non-planar areas of the passivation layer, are located relatively far away from the solder ball.

In examples, the RDL 110 further includes an insulation layer 216 (e.g., polyimide, polybenzoxazole (PBO), benzocyclobutene (BCB)) that abuts portions of the passivation layer 209, and also includes metal layers 218, 220, 222 that abut portions of the passivation layer 209. The RDL 110 also includes a metal layer 224 (also called an under bump metallization, or UBM), which may include at least one of copper, titanium, tungsten, and/or nickel and which may have an area ranging from 2000 microns$^2$ to 62000 microns$^2$. The insulation layer 216 and the metal layers 218, 220, 222, 224 are patterned to implement a topology that establishes desired connections between the solder ball 112 that couples to the metal layer 224 and the vias 210, 212, 214. In examples, the metal layers 218, 220, 222, 224 facilitate the transfer of electrical signals, and the insulation layer 216 insulates the metal layers 218, 220, 222 from each other, as shown. In examples, the metal layer 218 abuts the vias 210. In examples, the metal layer 220 abuts the via 212. In examples, the metal layer 222 abuts the vias 214. The metal layer 224 couples to the metal layer 218 via an orifice 217. The physical dimensions, including various lengths, widths, and thicknesses, of the insulation layer 216 and the metal layers 218, 220, 222 may vary as appropriate for a given application. In examples, each of the metal layers 218, 220, 222 is composed of copper or aluminum.

The metal layers 218, 224 couple to each other at the orifice 217. The orifice 217 thus defines the point of contact at which the metal layers 218, 224 couple to each other. In examples, the orifice 217 has a maximal horizontal size of less than 100 microns. In examples, the orifice 217 has a maximal horizontal size of less than 75 microns. In examples, the orifice 217 has a maximal horizontal size of less than 50 microns. In examples, the orifice 217 has a maximal horizontal size of less than 35 microns. In examples, the orifice 217 has a maximal horizontal size of less than 20 microns. In examples, the orifice 217 has a maximal horizontal size of less than 10 microns. A narrower orifice 217 generally enables a more efficient use of space in the RDL 110, because a narrower orifice 217 enables other metal layers, such as the metal layers 220 and 222, to be positioned closer to the metal layer 218. Another benefit of a narrower orifice 217 is that it enables flexibility of design by miniaturization of the metal layer 218. Miniaturization of the metal layer 218 enables flexible geometries to be designed for high electrical efficiency of circuitries such as field effect transistors. As a result, the RDL 110 topology is denser, and thus more efficient, than it would be if the orifice 217 were wider. In FIG. 2, vertical planes 200, 202, 204, 205, 206, 208 demonstrate the vertical alignment of various vias 210, 212, 214 with the metal layer 224, which is indicative of the increased density of the RDL 110 made possible by the relatively narrow orifice 217. The narrower the orifice 217, the more efficient the topology of the RDL 110. However, reducing the diameter of a conductor can reduce its current throughput. Accordingly, narrowing the orifice 217 can restrict current flow through the orifice 217. Current flow can also be restricted by electromigration effects at the interface of the metal layer 224 and the solder ball 112, and such effects may be more restrictive on current flow than the size of the orifice 217, meaning that these effects are the bottleneck on current flow, not the orifice 217. However, it is possible that the orifice 217 can be narrowed to such a degree that the orifice 217 becomes the primary restriction on current flow (e.g., the bottleneck). Thus, the specific maximal horizontal size of the orifice 217 may in some examples be chosen based on the current flow restrictions imposed by the aforementioned electromigration effects. Stated another way, restrictions on current flow caused by these effects and/or by the maximal horizontal size of the orifice 217 may be balanced with improvements in RDL 110 density and efficiency achieved with smaller maximal horizontal size of the orifice 217.

In examples, the maximal horizontal size of the orifice 217 is the maximal horizontal dimension in any direction in the horizontal plane. For example, if the orifice 217 has an obround shape, the maximal horizontal size may refer to the length of the obround in the horizontal plane. If the orifice 217 has a rectangular (or polygonal) shape, the maximal horizontal size may refer to the length of the rectangle in the horizontal plane. Similarly, if the orifice 217 has a circular shape, the maximal horizontal size may refer to the diameter or radius of the circle in the horizontal plane. In examples, the maximal horizontal size of the orifice 217 refers to the total horizontal area of the orifice 217 in the horizontal plane. Thus, for instance, if the orifice 217 is a circle, the total horizontal area may be determined as the product of pi and the radius of the circle squared. In some such examples, the maximal horizontal area of the orifice 217 is 32400 microns$^2$. In some such examples, the maximal horizontal area of the orifice 217 is 3000 microns$^2$. In some such examples, the maximal horizontal area of the orifice 217 is 1875 microns$^2$. In some such examples, the maximal horizontal area of the orifice 217 is 750 microns$^2$. In some such examples, the maximal horizontal area of the orifice 217 is 350 microns$^2$. In some such examples, the maximal horizontal area of the orifice 217 is 250 microns$^2$. In some such examples, the maximal horizontal area of the orifice 217 is 80 microns$^2$. In some such examples, the maximal horizontal area of the orifice 217 is 20 microns$^2$. In some such examples, the maximal horizontal area of the orifice 217 ranges from 20 microns$^2$ to 32400 microns$^2$. Other horizontal areas are contemplated and included in the scope of this disclosure.

The dimension(s) in which the maximal horizontal size is determined has implications on the RDL 110 topology and density. For example, if the orifice 217 is a rectangle with a length different than its width, then orienting the rectangle in different directions will result in differing possible RDL topologies. For instance, orienting the rectangle in a first direction may mean that certain metal layers may be positioned close to the orifice 217, while orienting the rectangle in a second direction may mean that those same metal layers cannot be positioned close to the orifice 217. Thus, not only the size of the orifice 217 but also its shape and orientation may impact the topology and density of the RDL 110 and thus are relevant factors to be considered when designing an RDL 110.

Other factors also may affect current throughput, such as the number and sizes of the vias 210, 212, 214 (which, in some examples, may have horizontal cross sectional dimensions ranging from 0.25 micron up to 4000 microns$^2$), as well as the number of metal layers that couple to the solder ball 112 and that couple to the semiconductor die 108. The maximal horizontal size, shape, and orientation of the orifice 217 are thus not mere design choices but rather have unexpected consequences for a variety of aspects of the CSP 106, including the topology and density of the RDL 110, current throughput between the solder ball 112 and the semiconductor die 108, number and sizes of the vias 210, 212, 214, connections between various metal layers, etc., each of which is a consideration in determining a suitable maximal horizontal size, shape, and orientation of the orifice 217.

In operation, electrical signals flow between the semiconductor die 108 and the PCB 102 via the conductive terminal 104, solder ball 112, metal layer 224, orifice 217, metal layer 218, and vias 210. The metal layers 220, 222 couple to other solder balls that are not expressly shown and that may be located away from the solder ball 112.

Figure 3:
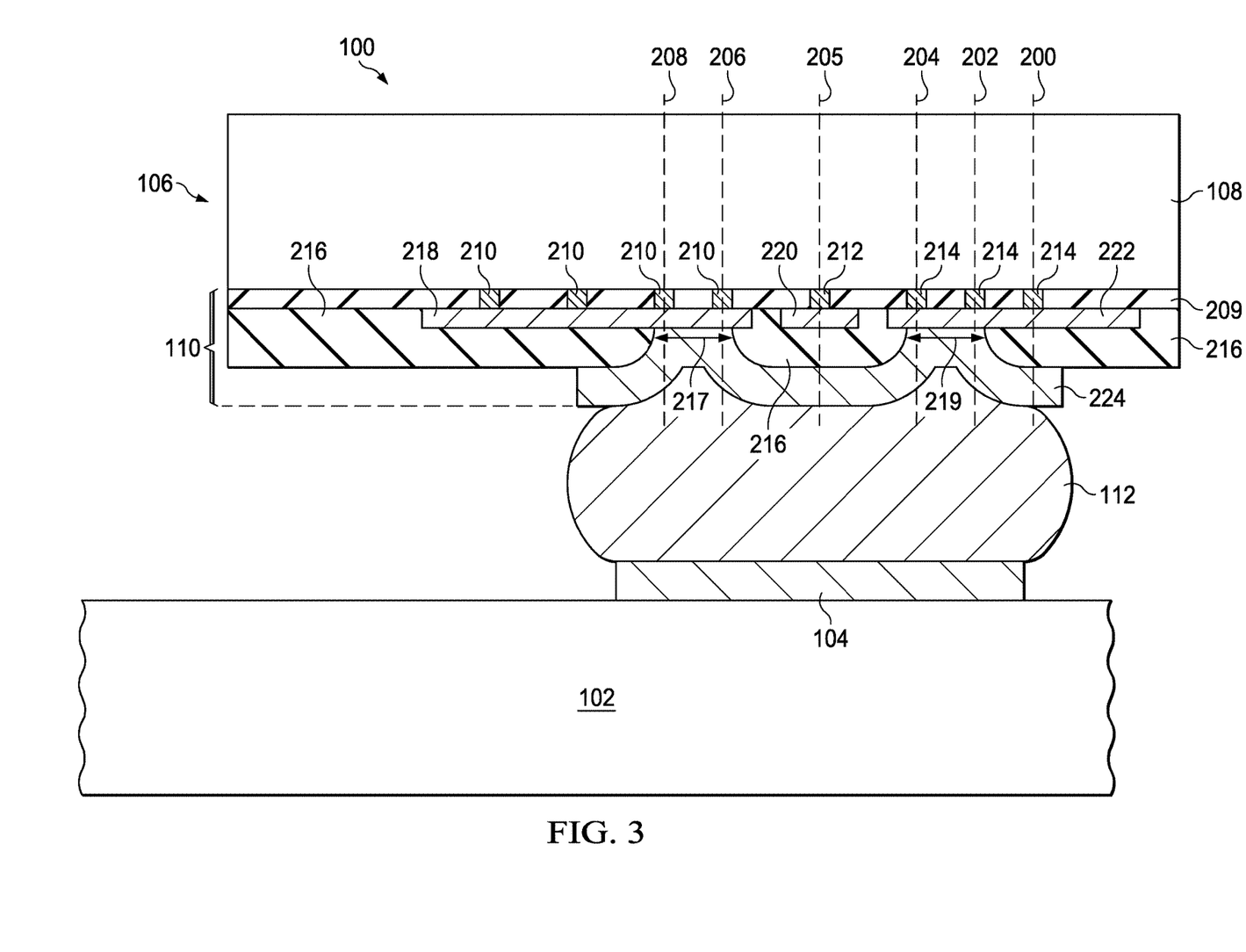
FIG. 3 is a profile, cross-sectional view of a portion of an electronic device that includes a CSP implementing another efficient RDL topology, in accordance with various examples.

FIG. 3 is a profile, cross-sectional view of a portion of an electronic device that includes a CSP implementing another efficient RDL topology, in accordance with various examples. The CSP 106 of FIG. 3 is virtually identical to the CSP 106 of FIG. 2, except that the CSP 106 of FIG. 3 includes an orifice 219 through which the metal layer 224 couples to the metal layer 222. The orifice 219 is formed by the insulation layer 216, and the orifice 219 defines a point of contact at which the metal layers 222, 224 abut each other. Because the metal layer 224 couples to both the metal layers 218, 222, a communication pathway is established between the solder ball 112 and the vias 210, 214. The description provided above regarding the sizing of the orifice 217 also applies to the orifice 219. In examples, the orifices 217, 219 have the same shape but different sizes. In examples, the orifices 217, 219 have different shapes but the same size. In examples, the orifices 217, 219 have differing shapes and sizes. In examples, the orifices 217, 219 have the same shape and the same size.

Figure 4A:
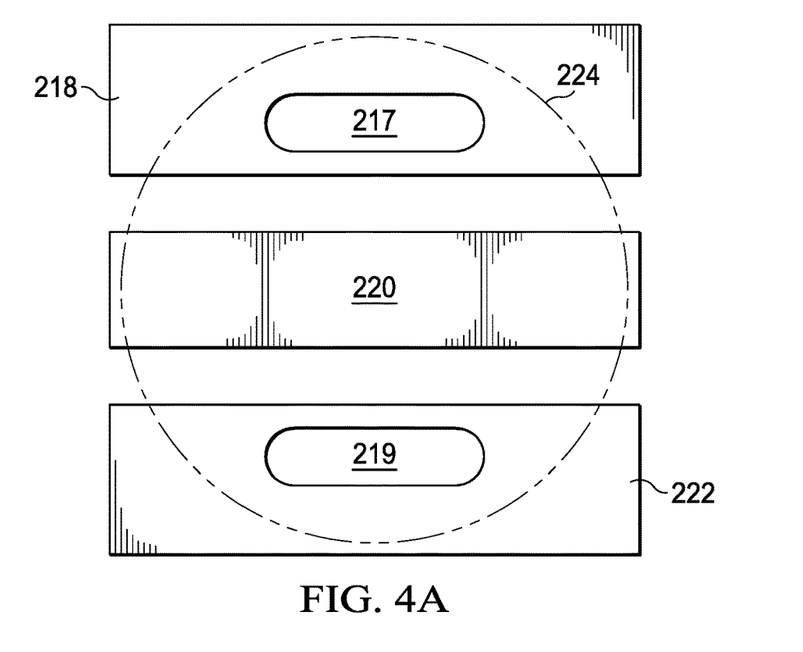
FIGS. 4A-4I are schematic, layered, bottom-up views of differing efficient RDL topologies, in accordance with various examples.

FIGS. 4A-4I are schematic, layered, bottom-up views of differing efficient RDL topologies, in accordance with various examples. In particular, FIG. 4A is a bottom-up view of the structure of FIG. 3, with the PCB 102, the conductive terminal 104, and the solder ball 112 excluded. As shown, the metal layer 224 couples to metal layers 218, 222 through the orifices 217, 219, respectively. FIG. 4A shows metal layer 222 present above the metal layer 224, but, as in FIG. 3, the metal layers 222, 224 are coupled to each other. FIG. 4A shows the orifices 217, 219 having horizontal, cross-sectional shapes that are obround. As described above, the orientations of the orifices 217, 219 can impact the topology of the RDL 110. For instance, if the orifices 217, 219 were kept the same size as shown in FIG. 4A but were rotated by 90 degrees, it may no longer be possible to accommodate the metal layer 220 in its current position, and thus some or all aspects (e.g., position, shape, orientation, size) of the metal layers 218, 220, and/or 222 would be adjusted accordingly.

Figure 4B:
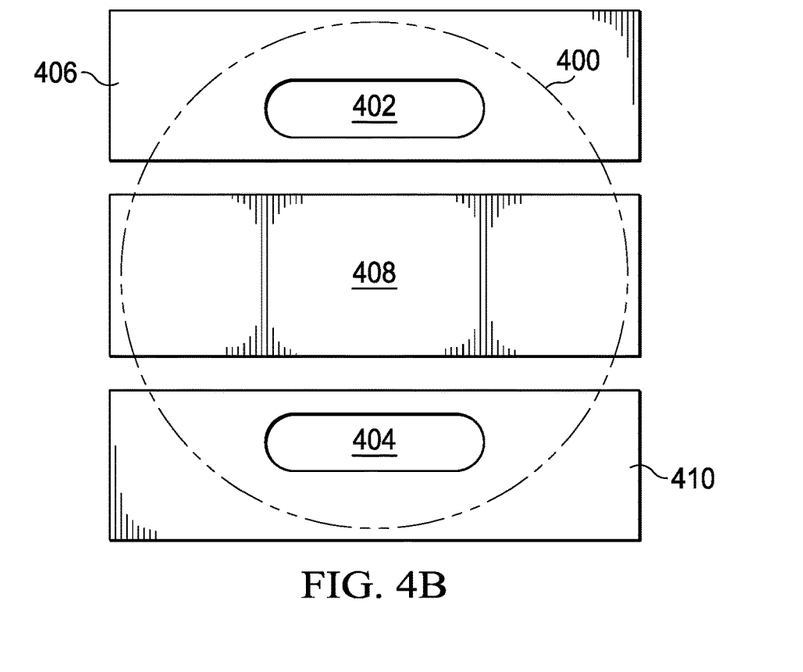

FIG. 4B is a bottom-up view of another example CSP implementing the efficient RDL topology described herein. FIG. 4B shows a metal layer 400 coupled to the metal layers 406, 410 through the orifices 402, 404, respectively. The metal layers 400, 408 do not couple to each other. As in FIG. 4A, the horizontal, cross-sectional shapes of the orifices 402, 404 are obround.

Figure 4C:
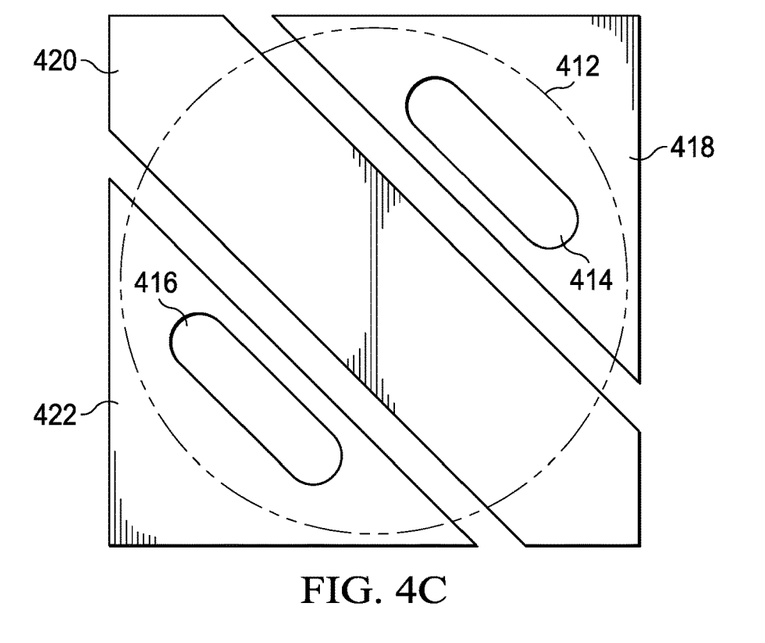

FIG. 4C is a bottom-up view of another example CSP implementing the efficient RDL topology described herein. FIG. 4C shows a metal layer 412 coupled to the metal layers 418, 422 through the orifices 414, 416, respectively. The metal layers 412, 420 do not couple to each other. As FIG. 4C shows, the horizontal, cross-sectional shapes of the orifices 414, 416 are obround.

Figure 4D:
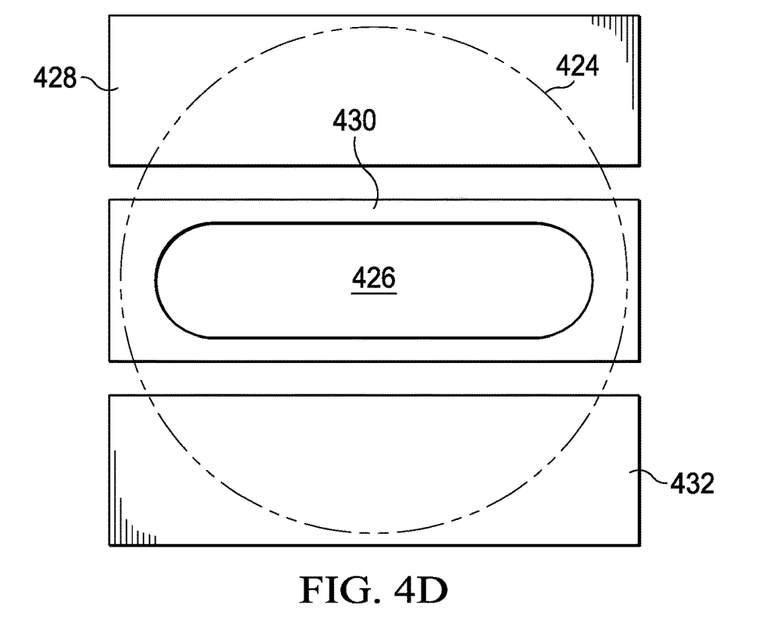

FIG. 4D is a bottom-up view of another example CSP implementing the efficient RDL topology described herein. FIG. 4D shows a metal layer 424 coupled to the metal layer 430 through the orifice 426. The metal layer 424 does not couple to the metal layers 428, 432. As FIG. 4D shows, the horizontal, cross-sectional shape of the orifice 426 is obround.

Figure 4E:
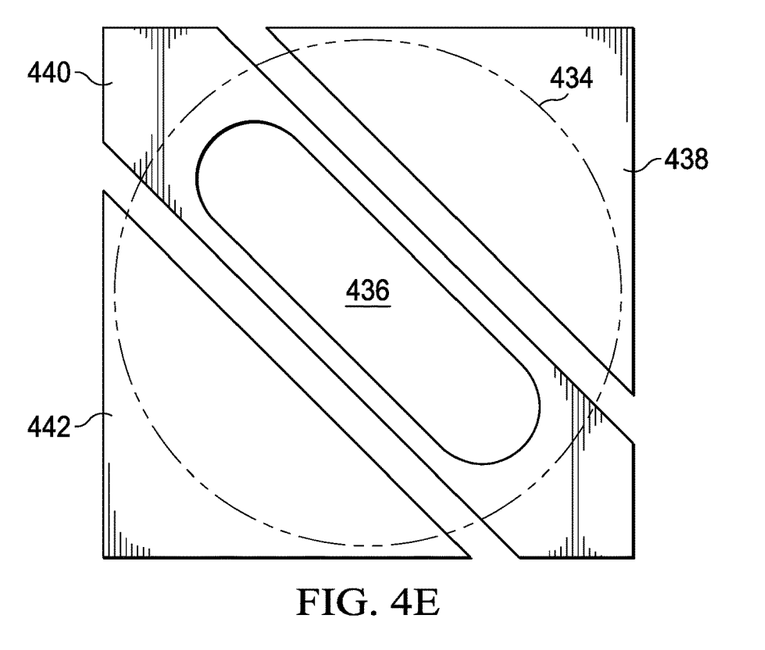

FIG. 4E is a bottom-up view of another example CSP implementing the efficient RDL topology described herein. FIG. 4E shows a metal layer 434 coupled to the metal layer 440 through an orifice 436. The metal layer 434 does not couple to metal layers 438, 442. As FIG. 4E shows, the horizontal, cross-sectional shape of the orifice 436 is obround.

Figure 4F:
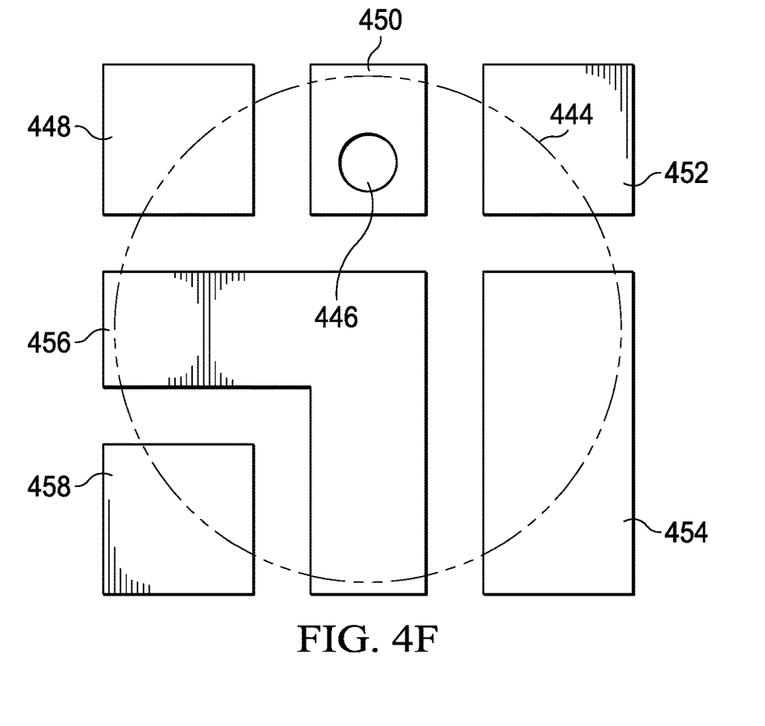

FIG. 4F is a bottom-up view of another example CSP implementing the efficient RDL topology described herein. FIG. 4F shows a metal layer 444 coupled to metal layer 450 through an orifice 446. The metal layer 444 does not couple to metal layers 448, 452, 454, 456, or 458. As FIG. 4F shows, the horizontal, cross-sectional shape of the orifice 446 is circular.

Figure 4G:
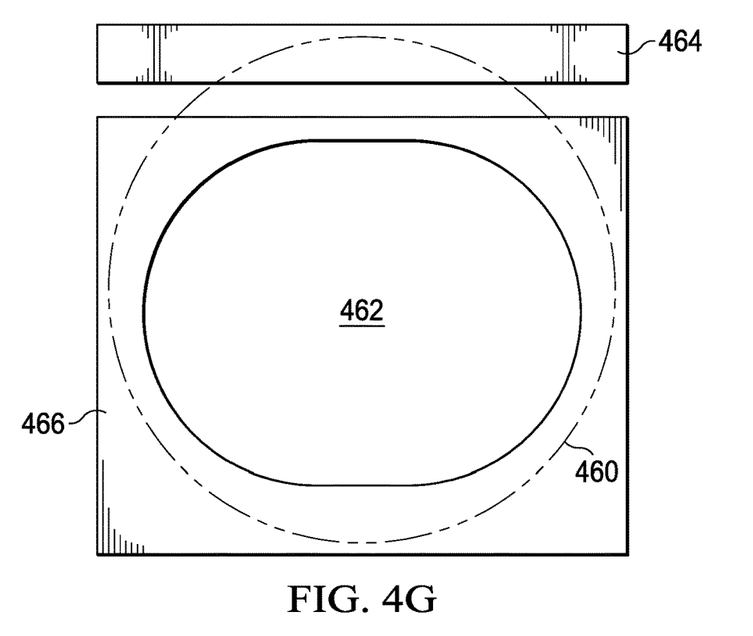

FIG. 4G is a bottom-up view of another example CSP implementing the efficient RDL topology described herein. FIG. 4G shows a metal layer 460 coupled to metal layer 466 through an orifice 462. The metal layer 460 does not couple to metal layer 464. As FIG. 4G shows, the horizontal, cross-sectional shape of the orifice 462 is oval.

Figure 4H:
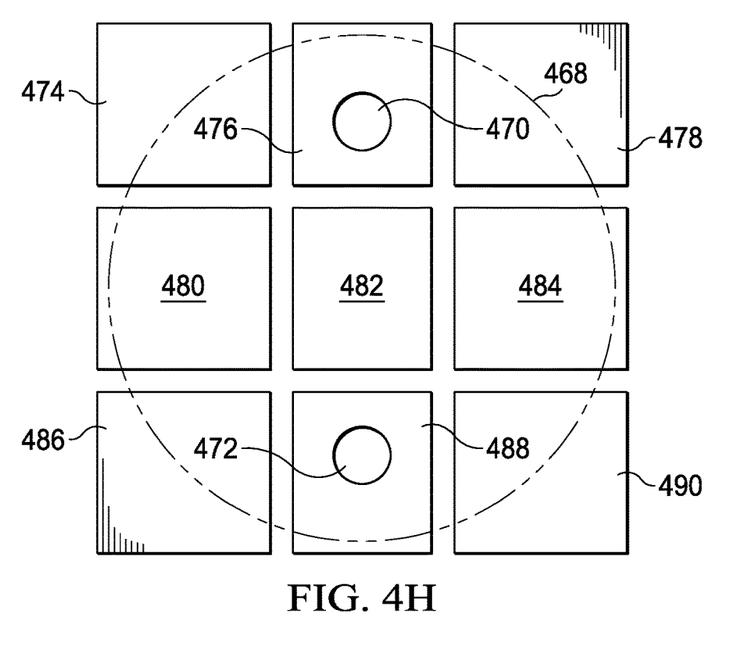

FIG. 4H is a bottom-up view of another example CSP implementing the efficient RDL topology described herein. FIG. 4H shows a metal layer 468 coupled to metal layers 476, 488 through orifices 470, 472, respectively. The metal layer 468 does not couple to metal layers 474, 478, 480, 482, 484, 486, or 490. As FIG. 4H shows, the horizontal, cross-sectional shapes of the orifices 470, 472 are circular.

Figure 4I:
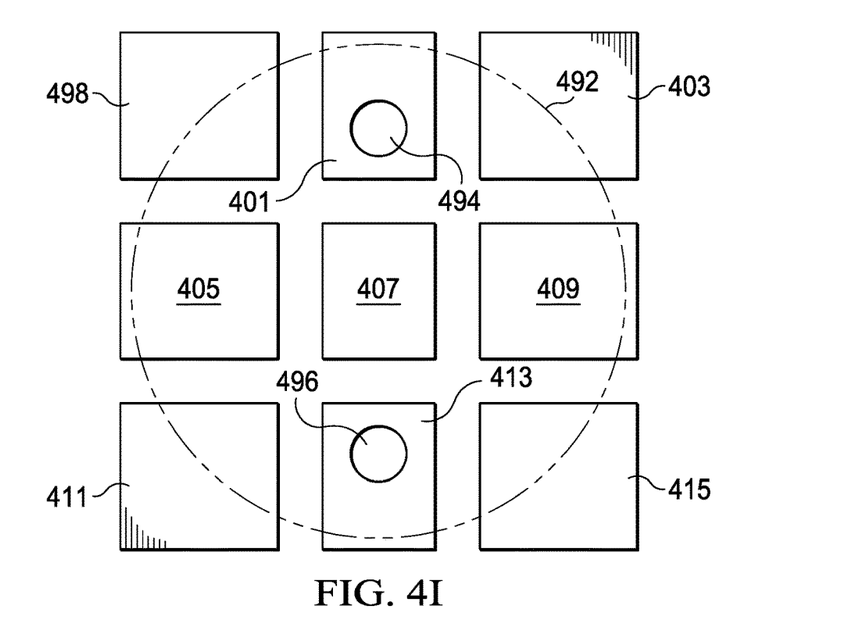

FIG. 4I is a bottom-up view of another example CSP implementing the efficient RDL topology described herein. FIG. 4I shows a metal layer 492 coupled to metal layers 401, 413 through orifices 494, 496, respectively. The metal layer 492 does not couple to metal layers 498, 403, 405, 407, 409, 411, or 415. As FIG. 4I shows, the horizontal, cross-sectional shapes of the orifices 494, 496 are circular.

Figure 5A:
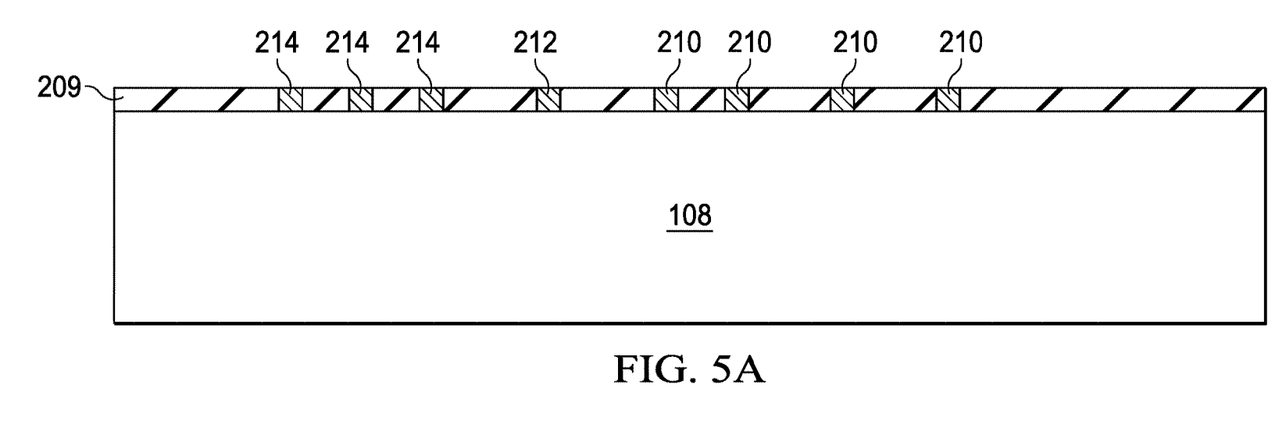
FIGS. 5A-5G is a process flow of a technique for manufacturing a CSP implementing an efficient RDL topology, in accordance with various examples.
Figure 5B:
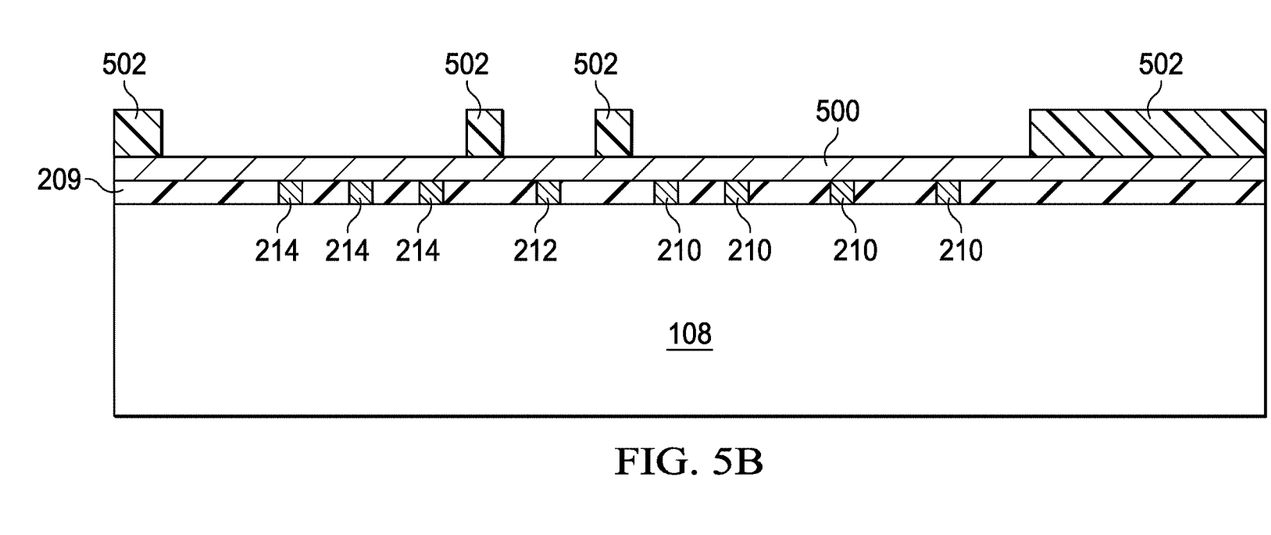
Figure 5C:
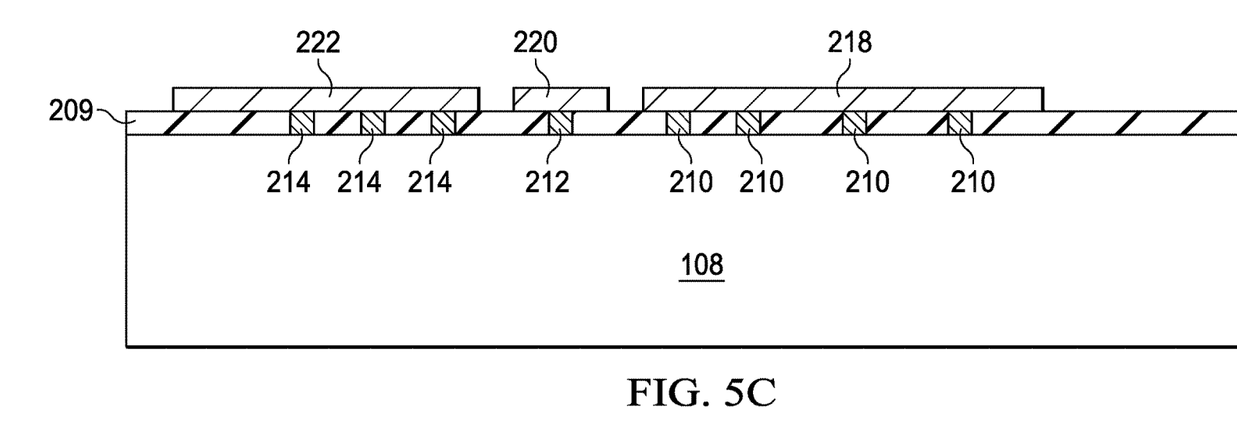
Figure 5D:
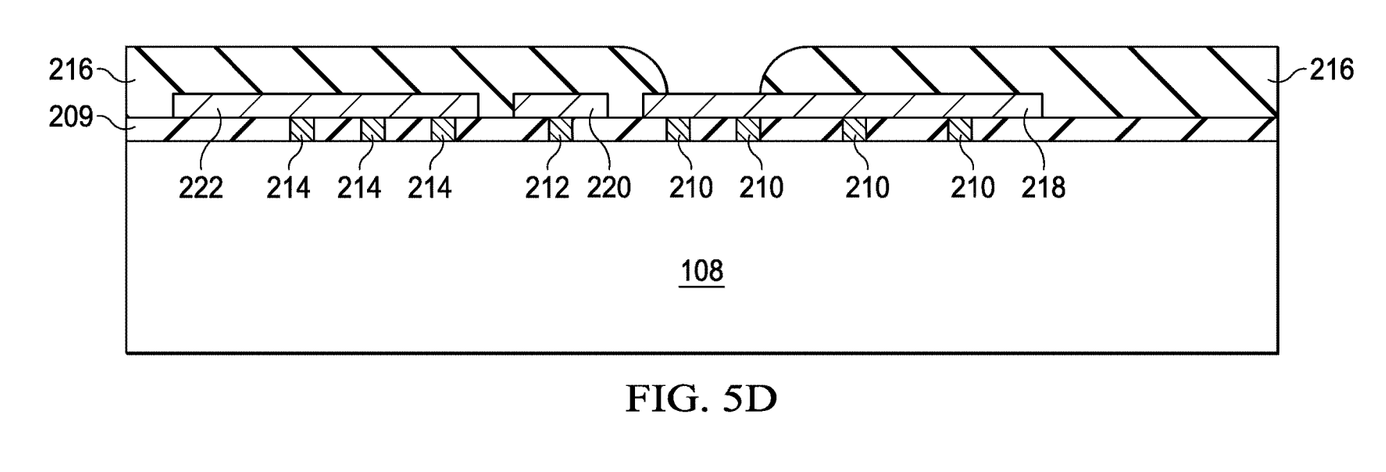
Figure 5E:
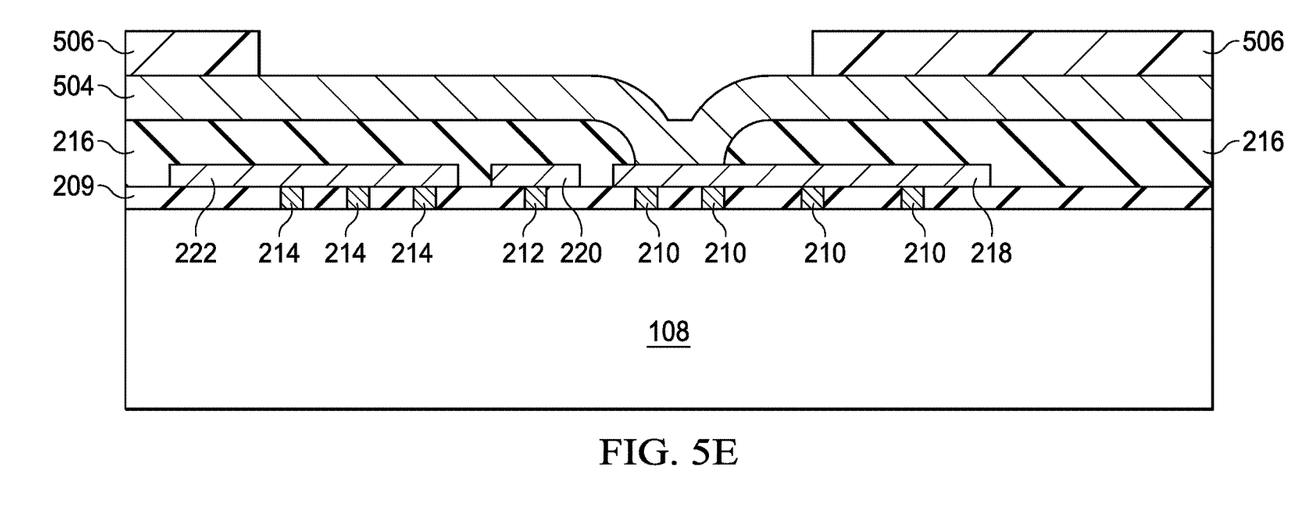
Figure 5F:
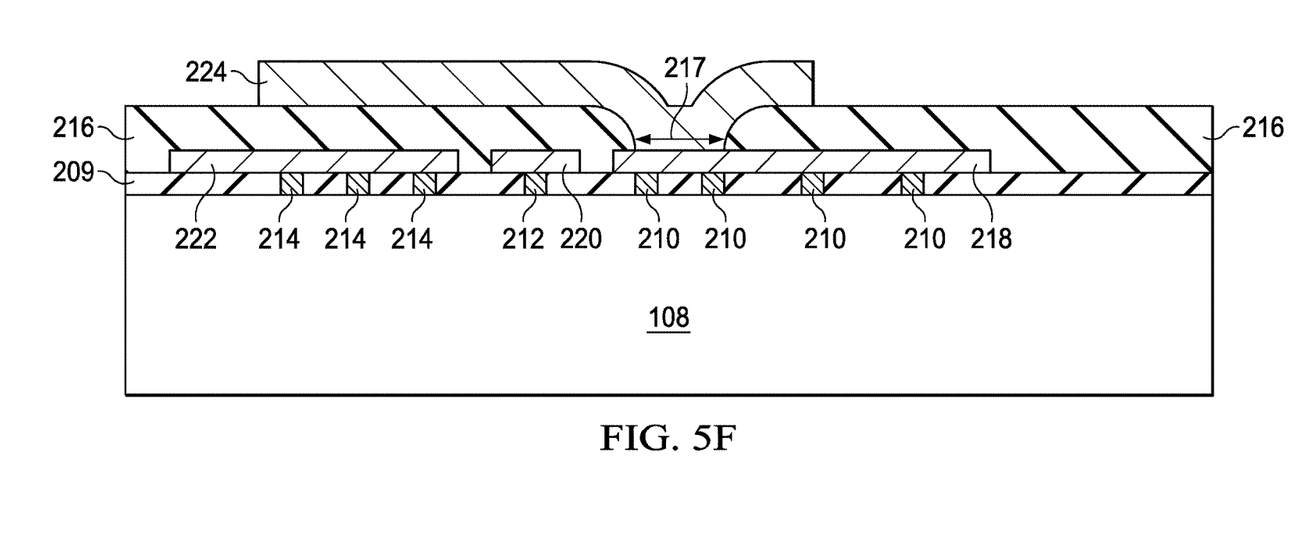
Figure 5G:
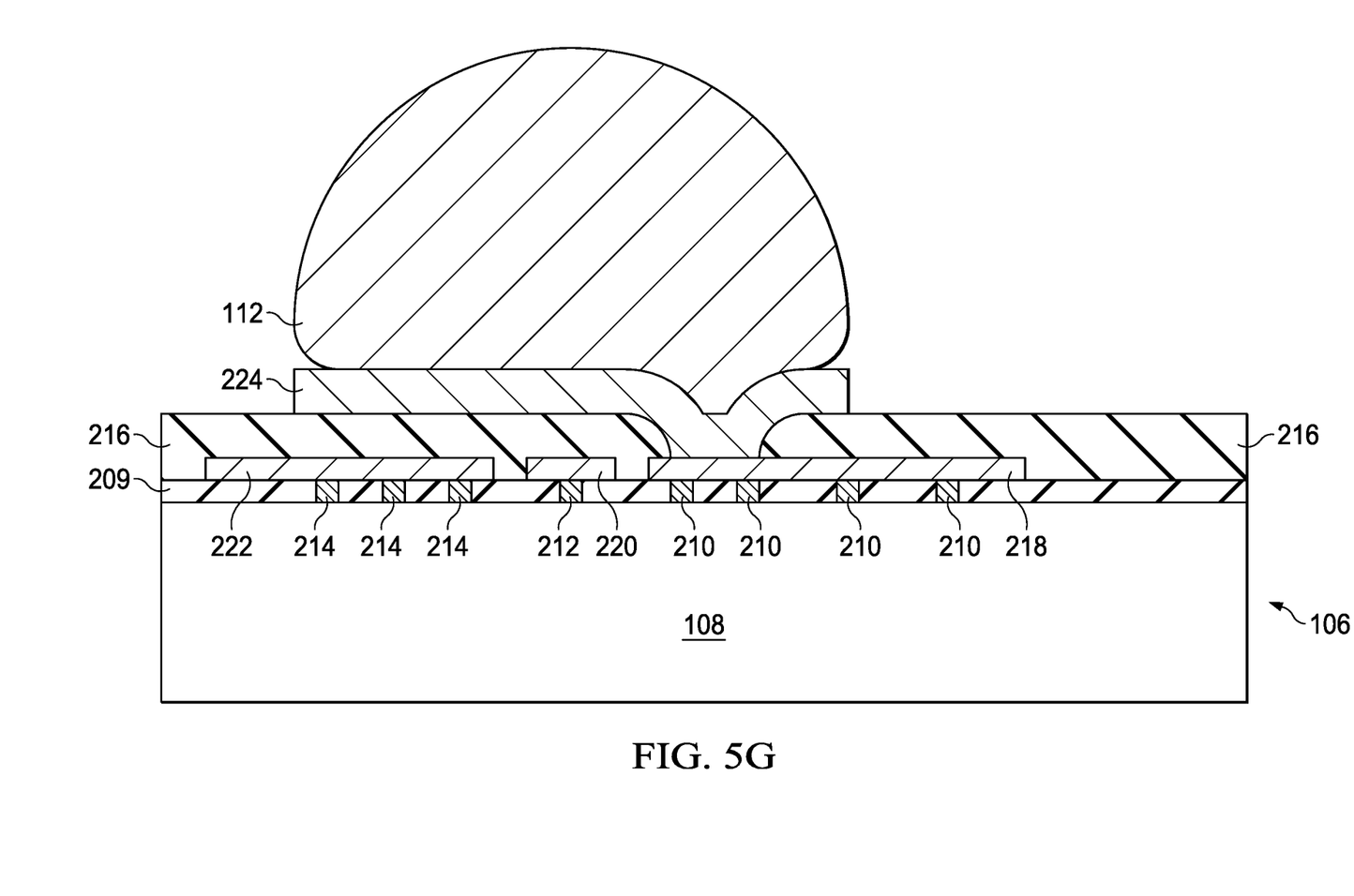
Figure 6:
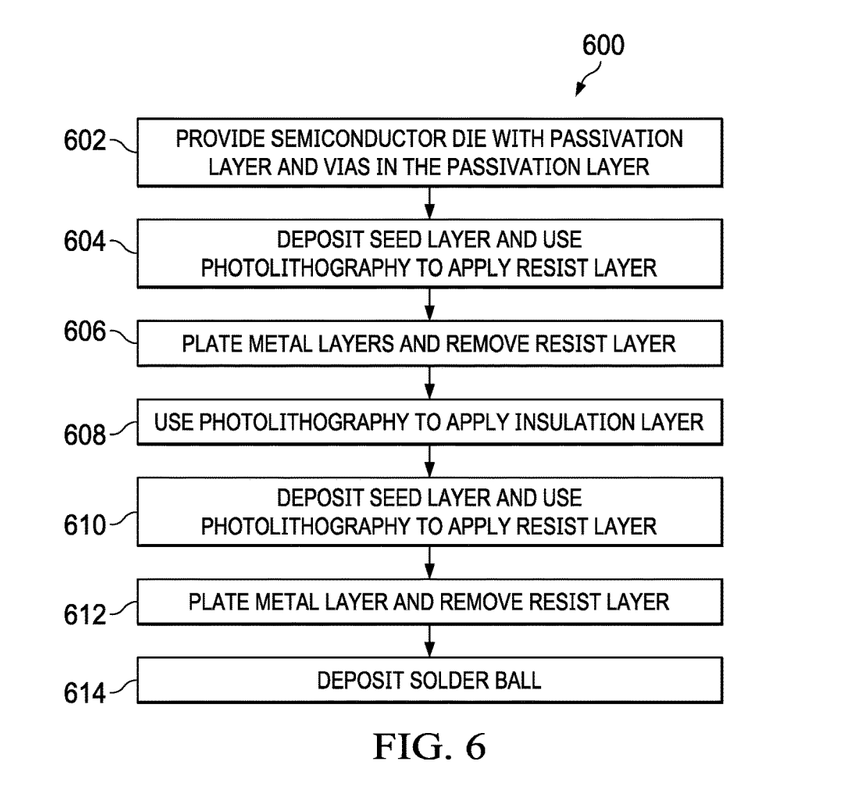
FIG. 6 is a flow diagram of a method for manufacturing a CSP implementing an efficient RDL topology, in accordance with various examples.

FIGS. 5A-5G is a process flow of a technique for manufacturing a CSP implementing an efficient RDL topology, in accordance with various examples. FIG. 6 is a flow diagram of a method 600 for manufacturing a CSP implementing an efficient RDL topology, in accordance with various examples. Accordingly, the process flow of FIGS. 5A-5G is now described in parallel with the method 600. The process flow and the method 600 may be used to form the CSP 106 of FIG. 2, for example.

The method 600 begins with providing a semiconductor die having a passivation layer and vias in the passivation layer (step 602). FIG. 5A shows the semiconductor die 108 with a passivation layer 209 positioned on the semiconductor die 108. The passivation layer 209 includes vias 210, 212, 214. The vias 210, 212, 214 may be formed, for instance, using a photolithography process in the passivation layer 209 to form orifices that are filled with a suitable seed layer and plated to form the vias 210, 212, 214 (e.g., using copper).

The method 600 includes depositing a seed layer and using photolithography processes to apply a photoresist layer (also called a resist layer) (step 604). FIG. 5B shows the deposition of a seed layer 500 and the application of a resist layer 502. Photolithography processes form the patterns in the resist layer 502.

The method 600 includes plating metal layers and removing the resist layer (step 606). FIG. 5C shows the plated metal layers 218, 220, 222, and the resist layer 502 (FIG. 5B) has been removed. The metal layer 218 abuts the vias 210, the metal layer 220 abuts the via 212, and the metal layer 222 abuts the vias 214.

The method 600 includes using photolithography to apply an insulation layer (step 608). FIG. 5D shows an insulation layer 216 that has been patterned using photolithography processes. As shown, the insulation layer 216 abuts the metal layers 218, 220, 222 as well as the passivation layer 209.

The method 600 includes depositing a seed layer and using photolithography to apply a resist layer (step 610). FIG. 5E shows the deposition of a seed layer 504 and the application of a resist layer 506. Photolithography processes form the patterns in the resist layer 506.

The method 600 includes plating a metal layer and removing the resist layer (step 612). FIG. 5F shows a metal layer 224 formed using a plating technique, as well as the resist layer 506 (FIG. 5E) having been removed. The metal layer 224 abuts the metal layer 218 through the orifice 217, as shown.

The method 600 includes depositing a solder ball (step 614). FIG. 5G shows the solder ball 112 having been deposited on the metal layer 224. The solder ball 112 may be used to couple the example CSP 106 of FIG. 5G to any suitable electronic device, such as a PCB.

The term "couple" is used throughout the specification. The term may cover connections, communications, or signal paths that enable a functional relationship consistent with the description of this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. Unless otherwise stated, "about," "approximately," or "substantially" preceding a value means +/−10 percent of the stated value. Modifications are possible in the described examples, and other examples are possible, within the scope of the claims.

What is claimed is:

1. A semiconductor package, comprising:
    a semiconductor die;
    a passivation layer on the semiconductor die, the passivation layer having a first surface abutting the semiconductor die and a second surface opposite the first surface, wherein the passivation layer includes a boundary corresponding to a footprint of the semiconductor die;
    a conductive via extended through the passivation layer and coupled to the semiconductor die, wherein the conductive via has a via surface approximately flush with the second surface of the passivation layer;
    a conductive pad on the passivation layer and coupled to the conductive via;
    an insulation layer over the conductive pad, the insulation layer having an opening extended to the conductive pad; and
    a metallic structure on the insulation layer, the metallic structure configured to couple to a solder ball, wherein the metallic structure is connected to the conductive pad through the opening.

2. The semiconductor package of claim 1, wherein the conductive via is located within a footprint of the metallic structure.

3. The semiconductor package of claim 1, wherein the conductive pad is a first conductive pad, the semiconductor package further comprising:
    a second conductive pad on the passivation layer, the second conductive pad coupled to the semiconductor die, wherein at least a portion of the second conductive pad is located within a footprint of the metallic structure.

4. The semiconductor package of claim 3, wherein the second conductive pad is electrically isolated from the first conductive pad and the metallic structure.

5. The semiconductor package of claim 3, wherein the conductive via is a first conductive via, the semiconductor package further comprising:
    a second conductive via extended through the passivation layer and configured to couple the semiconductor die with the second conductive pad, wherein the second conductive via has a second via surface approximately flush with the second surface of the passivation layer, and wherein the first conductive via and the second conductive via are located within the footprint of the metallic structure.

6. The semiconductor package of claim 3, wherein the insulation layer has another opening extended to the second conductive pad, through which the metallic structure is connected to the second conductive pad.

7. The semiconductor package of claim 1, wherein the second surface of the passivation layer is a planar surface extended throughout the semiconductor die.

8. The semiconductor package of claim 1, wherein:
    the passivation layer includes an oxide layer, a nitride layer, an oxynitride layer, or a combination thereof; and
    the insulation layer includes polyimide, polybenzoxazole, benzocyclobutene, or a combination thereof.

9. A semiconductor package, comprising:
    a semiconductor die;
    a passivation layer over the semiconductor die;
    a first conductive pad on the passivation layer, the first conductive pad coupled to the semiconductor die through a first via formed in the passivation layer;
    a second conductive pad on the passivation layer, the second conductive pad coupled to the semiconductor die through a second via formed in the passivation layer;
    an insulation layer over the first and second conductive pads, the insulation layer having an opening extended to the first conductive pad; and
    a metallic structure on the insulation layer, the metallic structure configured to couple to a solder ball, wherein:
        the metallic structure is connected to the first conductive pad through the opening; and
        at least a portion of the first conductive pad corresponding to the opening and at least a portion of the second conductive pad are located within a footprint of the metallic structure.

10. The semiconductor package of claim 9, wherein the first via and the second via are located within the footprint of the metallic structure.

11. The semiconductor package of claim 9, wherein:
    the passivation layer has a surface facing away from the semiconductor die; and
    the first via and the second via are filled with a conductive material such that the first and second vias have a via surface approximately flush with the surface of the passivation layer.

12. The semiconductor package of claim 9, wherein the second conductive pad is electrically isolated from the first conductive pad and the metallic structure.

13. The semiconductor package of claim 9, wherein the insulation layer has another opening through which the metallic structure is connected to the second conductive pad.

14. The semiconductor package of claim 13, further comprising:
a third conductive pad on the passivation layer, the third conductive pad coupled to the semiconductor die through a third via formed in the passivation layer, wherein:
the third conductive pad is electrically isolated from the metallic structure; and
at least a portion of the third conductive pad is located within the footprint of the metallic structure.

15. A semiconductor package, comprising:
a metallic structure formed on a first surface of an insulation layer, the metallic structure configured to couple to a solder ball;
a first conductive pad abutting a second surface of the insulation layer opposite to the first surface, wherein the insulation layer includes an opening through which the metallic structure couples to the first conductive pad; and
a second conductive pad abutting the second surface of the insulation layer, the second conductive pad being electrically isolated from the metallic structure and the first conductive pad, wherein at least a first portion of the first conductive pad corresponding to the opening and at least a second portion of the second conductive pad are located within a footprint of the metallic structure.

16. The semiconductor package of claim 15, further comprising:
a passivation layer over a semiconductor die, the passivation layer having a surface facing away from the semiconductor die on which the first and second conductive pads are formed;
a first via formed in the passivation layer, the first via coupling the first conductive pad to the semiconductor die; and
a second via formed in the passivation layer, the second via coupling the second conductive pad to the semiconductor die.

17. The semiconductor package of claim 16, wherein the first via and the second via are located within the footprint of the metallic structure.

18. The semiconductor package of claim 16, wherein the first via and the second via are filled with a conductive material such that the first and second vias have a via surface approximately flush with the surface of the passivation layer.

19. The semiconductor package of claim 15, further comprising:
a third conductive pad abutting the second surface of the insulation layer opposite to the first surface, wherein the insulation layer includes another opening through which the metallic structure couples to the third conductive pad.

20. The semiconductor package of claim 19, wherein the at least the second portion of the second conductive pad is located between the first and third conductive pads.

21. The semiconductor package of claim 15, further comprising:
a third conductive pad abutting the second surface of the insulation layer opposite to the first surface, wherein the third conductive pad is electrically isolated from the metallic structure and the second conductive pad.

22. The semiconductor package of claim 21, wherein the at least the first portion of the first conductive pad is located between the second and third conductive pads.

* * * * *